United States Patent [19]

Solomon

[11] Patent Number: 5,030,828
[45] Date of Patent: Jul. 9, 1991

[54] RECESSED ELEMENT PHOTOSENSITIVE DETECTOR ARRAY WITH OPTICAL ISOLATION

[75] Inventor: Allen L. Solomon, Fullerton, Calif.

[73] Assignee: Grumman Aerospace Corporation, New York, N.Y.

[21] Appl. No.: 542,895

[22] Filed: Jun. 25, 1990

[51] Int. Cl.[5] .......................... G01J 1/00; H01L 31/00
[52] U.S. Cl. .................... 250/338.4; 250/332; 250/349; 250/370.13; 250/370.08
[58] Field of Search ............ 250/370.11, 370.08, 250/370.13, 332, 330, 368, 338.4, 338.1, 353, 349

[56] References Cited

U.S. PATENT DOCUMENTS

| | | | |
|---|---|---|---|
| 4,527,183 | 7/1985 | Anthony et al. | 250/370.08 |
| 4,618,763 | 10/1985 | Schmitz | 250/332 |
| 4,633,086 | 12/1986 | Parrish | 250/338 |
| 4,659,931 | 4/1987 | Schmitz et al. | 250/338 |
| 4,675,525 | 6/1987 | Amingual et al. | 250/352 |
| 4,692,610 | 9/1987 | Szuchy | 250/227 |
| 4,694,177 | 9/1987 | Akai | 250/370.11 |
| 4,698,603 | 10/1987 | Clarius | 332/31 R |
| 4,703,170 | 10/1987 | Schmitz | 250/332 |
| 4,718,075 | 1/1988 | Horn | 378/91 |
| 4,734,577 | 3/1988 | Szuchy | 250/227 |
| 4,784,970 | 11/1988 | Solomon | 437/51 |
| 4,792,672 | 12/1988 | Schmitz | 250/358.1 |
| 4,794,092 | 12/1988 | Solomon | 437/51 |
| 4,852,141 | 7/1989 | Horn | 378/147 |

FOREIGN PATENT DOCUMENTS

| | | | |
|---|---|---|---|
| 0142300 | 7/1985 | Japan | 250/370.11 |
| 2167279 | 5/1986 | United Kingdom | 250/370.11 |

*Primary Examiner*—Carolyn E. Fields
*Assistant Examiner*—Drew A. Dunn
*Attorney, Agent, or Firm*—Stetina and Brunda

[57] ABSTRACT

A recessed element photosensitive detector array with optical isolation having an increased sensitivity to incident photons and having reduced crosstalk due to low angle of incidence photons is disclosed. The array comprises a substrate, a plurality of parallel elongate cavities formed within the substrate, photosensitive detector elements formed within the cavities, and an optical insulating layer adjacent each of said cavities to optically isolate the cavities from each other. The elongate cavities provide an increased detector element surface area which increases the sensitivity of the recesses element photosensitive detector array to incident photons. The increased sensitivity of the array is due to an increase in the probability of capturing incident photons. The optical isolation provided by the optical insulating layer substantially reduces crosstalk among adjacent detector elements for low angle of incidence photons. The increased probability of capturing incident photons eliminates the need for an anti-reflective coating.

34 Claims, 6 Drawing Sheets

RECESSED ELEMENT PHOTOSENSITIVE DETECTOR ARRAY WITH OPTICAL ISOLATION

FIELD OF THE INVENTION

The present invention relates generally to photosensitive detector element arrays and more particularly to a recessed element photosensitive detector array with optical isolation having an increased sensitivity to incident photons and also having reduced crosstalk due to low angle of incidence photons. Elongate cavities provide an increased detector element surface area which increases the sensitivity of the recessed element photosensitive detector array to incident photons. Optical isolation provided by an optical insulating layer substantially reduces crosstalk among adjacent detector elements for low angle of incidence photons.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The infrared wavelengths extend from 0.75 micrometers to 1 millimeter. The function of infrared detectors is to respond to energy of a wavelength within some particular portion of the infrared region.

Heated objects radiate thermal energy having characteristic wavelengths within the infrared spectrum. Different levels of thermal energy, corresponding to different sources of heat, are characterized by the emission of radiation distributed within different portions of the infrared frequency spectrum. No single detector is highly sensitive over the entire infrared frequency spectrum. Thus, detectors are selected in accordance with their sensitivity in the range corresponding to the particular detection function of interest to the designer.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change, the quantity of infrared radiation can be derived.

Photosensitive detectors (e.g., photoconductive and photovoltaic detectors), absorb the infrared energy directly into the electronic structure of the material, inducing an electronic transition which leads to a change in the electrical conductivity (photoconductors) or to the generation of an output voltage across the terminals of the detector (photovoltaic detectors). The precise change that is affected is a function of various factors including the particular detector material selected, the doping density of that material and the detector area.

Current infrared imaging systems incorporate arrays of large numbers of discrete, highly sensitive detector elements, the outputs of which are connected to image processing circuitry. By rapidly analyzing the pattern and sequence of detector element excitation, the processing circuitry can identify and track sources of infrared radiation.

A contemporary array of detectors may, for example, contain 256 detectors on a side, or a total of 65,536 detectors, the size of each square detector being approximately 0.0035 inches on a side with 0.0005 inches spacing between detectors. Such an array would therefore be 1.024 inches on a side. This array may, in turn, be joined to form a larger array that contains 25 million detectors or more.

Contemporary detector arrays utilize planar semiconductor detector elements formed upon a substrate. P-type and n-type regions are formed in the semiconductor. Connections are made to the p-type and n-type semiconductor regions. This process results in an array of planar photosensitive detector elements, where each detector element can be accessed individually.

Such contemporary planar detector element arrays commonly require the use of anti-reflection coatings to maximize absorption of incident radiation. Anti-reflection coatings insure that a minimum of incident radiation is lost due to reflection.

The application of anti-reflection coatings to detector element arrays is an elaborate and difficult process which must designed with great care to avoid absorption of the radiation to be detected. Furthermore, the application of anti-reflective coatings can contribute to an already poor yield problem in the overall detector element array fabrication process. It would be desirable to eliminate the anti-reflective coating step from the detector element array fabrication process, thereby retaining sensitivity and the yield of the process.

Planar arrays are highly susceptible to interelement crosstalk since a beam of radiation with a low angle of incidence can illuminate more than a single detector element. This crosstalk results in a blurred image. It would therefore be desirable to reduce crosstalk as much as possible to obtain a sharp image.

As such, although the prior art has recognized the problems of detector element sensitivity, crosstalk, and the need for anti-reflective coatings, the proposed solutions have to date been ineffective in providing a satisfactory remedy.

SUMMARY OF THE INVENTION

The present invention comprises a recessed element photosensitive detector array with optical isolation having an increased sensitivity to incident photons and having reduced crosstalk due to low angle of incidence beams of photons. The recessed element photosensitive detector array with optical isolation comprises a substrate, a plurality of parallel elongated cavities formed within the substrate, photosensitive detector elements formed within the cavities, and an optical insulating layer substantially surrounding each of the cavities to optically isolate the cavities from each other.

The elongate cavities provide an increased detector element surface area which increases the probability of capturing incident photons. Increased sensitivity results from the increase in the probability of capturing incident photons. The probability of capturing incident photons is increased since incident photons which are not immediately absorbed and are reflected, are multiply reflected within the elongate cavity and then absorbed when they are again incident upon a photosensitive surface within the cavity. The use of such elongated cavities thus permits the detector element surface area to be increased while the area of photoelements in the plane of the array surface is retained.

The increased sensitivity and the unique geometry of the detector elements of the present invention eliminate the requirement for an anti-reflective coating. Photons reflected from the detector element's surface in the present invention tend to be reflected onto another portion of the same detector element, thus increasing the probability of detection. Photons reflected from the surface of a contemporary planar detector element are reflected away from the detector element, thus requiring the use of anti-reflective coatings.

The optical isolation provided by the opaque layer substantially reduces crosstalk among adjacent detector elements for low angle of incidence beam's photons. Such low angle of incidence beam's photons incident upon one cavity are effectively prevented from being transmitted through the cavity wall to an adjacent cavity.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

Figure 1:
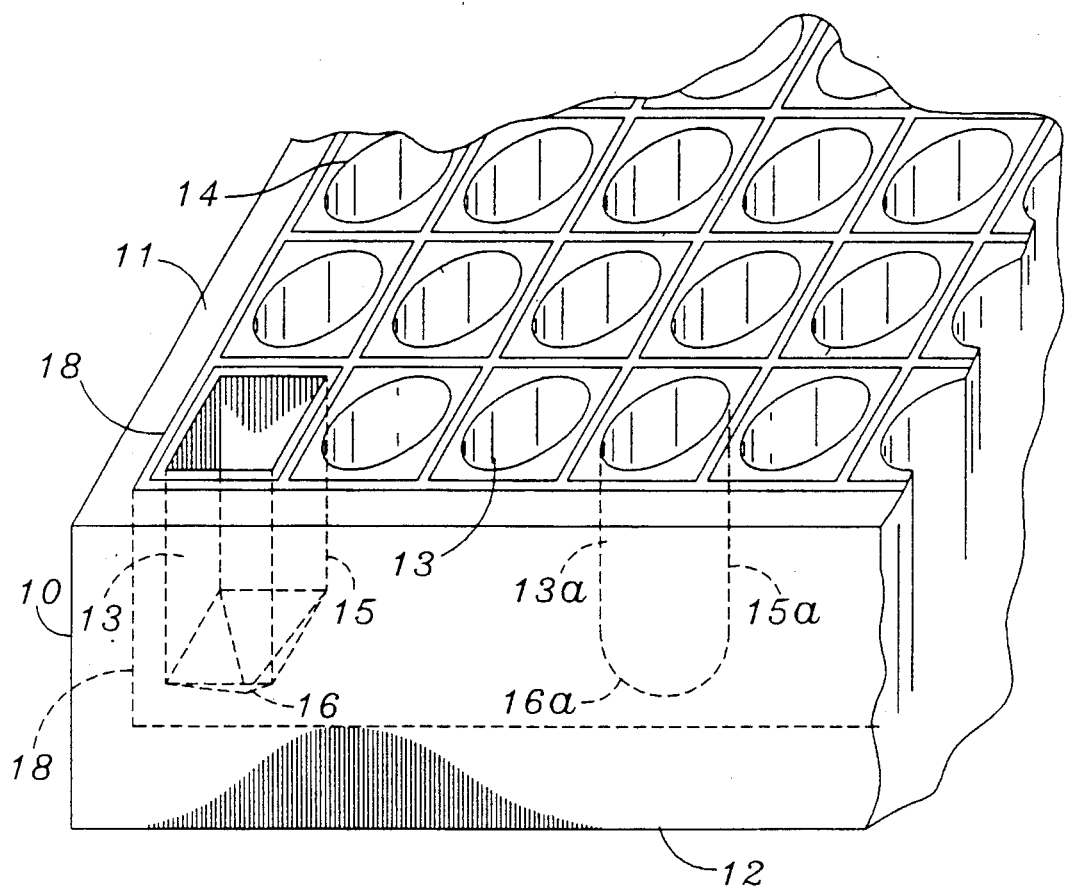
FIG. 1 is a sectional perspective view of a recessed element photosensitive detector array with optical isolation showing a cavity with rectangular walls and a pyramidal floor and showing a cavity with cylindrical walls and a round floor.

The recessed element photosensitive detector array with optical isolation of the present invention is illustrated in FIGS. 1-11 of the drawings which depict two presently preferred embodiments of the invention.

The detailed description set forth below in connection with the appended drawings is intended as a description of the presently preferred embodiments of the invention, and is not intended to represent the only forms in which the present invention may be constructed or utilized. The description sets forth the functions and sequence of steps of constructing and operating the invention in connection with the illustrated embodiments. It is understood, however, that the same or equivalent functions and sequences may be accomplished by different embodiments that are also intended to be encompassed within the spirit and scope of the invention.

Referring now to FIGS. 1, 2, 4 and 5, the recessed element photosensitive detector array with optical isolation of the present invention comprises a substrate 10 having first 11 and second 12 planar surfaces, substantially parallel elongate cavities 13 formed within the substrate 10, and a layer of optical isolating material 18 substantially surrounding each of the cavities 13. In the preferred embodiments, the optical isolating material 18 extends through the substrate 10 from the first surface 11 to the second surface 12. Each cavity 13 has an opening 14 upon the first planar surface 11 of the substrate 10.

Figure 2:
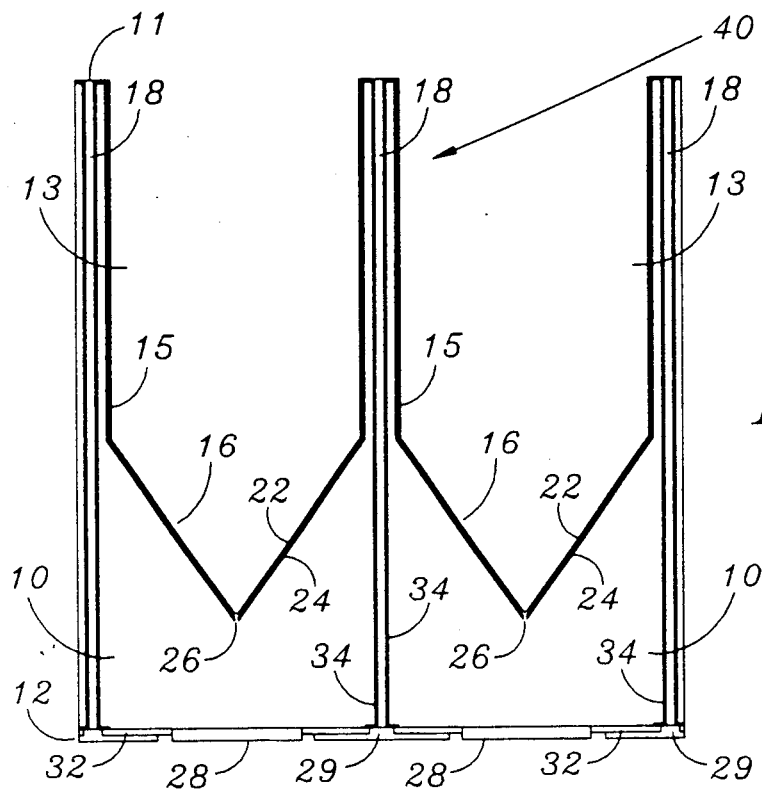
FIG. 2 is a cross-sectional side view of two of the rectangular cavities of FIG. 1.

FIG. 2 illustrates both a cavity 13 having rectangular walls 15 and a pyramidal floor 16 as well as a cavity 13a having cylindrical walls 15a and a round floor 16a. An array would typically be comprised of cavities of a single type. The two different types are shown together for the purposes of illustration only.

With particular reference to FIG. 2, each of the cavities 13 of the first embodiment has a vertical wall 15 and a pyramidal floor 16. The wall 15 and floor 16 of each cavity 13 has a body of detector material formed as a layer thereon. The body of detector material or the substrate 10 is comprised of a semiconductor material of a first type 22 and a semiconductor material of a second type 24 formed upon the substrate 10. The semiconductor material of a second type 24 is formed as a layer upon the substrate 10 and the semiconductor material of the first type 22 is formed as a layer upon the semiconductor material of a second type 24. In the preferred embodiments the substrate 10 is comprised of a semiconductor material of a first type, e.g., n-type (100) silicon, although those skilled in the art will recognized that other materials may be used. An aperture 26, formed at the apex of the pyramidal floor 16 provides direct electrical connection between the semiconductor material of a first type 22 and the substrate 10.

A first electrical contact 28 provides an electrical interface between the substrate 10 for a particular cavity 13 and external circuitry (not shown). A second or common electrical contact 29 provides electrical communication between the semiconductor material of a second type 24, e.g. p-type, and external circuitry (not shown). An insulating layer 32 insulates the common contacts 29 from the substrate 10. A diffusion layer 34 of semiconductor material of the second type provides electrical communication between the common contact 29 and the semiconductor material of a second type 24 formed within the cavity 13 and electrically isolates these contacts from the substrate material.

Optical insulating material 18 isolates each cavity 13 from adjacent cavities such that a low angle of incidence of photon 40 will be incapable of penetrating the wall 15 of one cavity 13 and entering a second cavity, thus producing crosstalk. A low angle of incidence photon is a photon which strikes the wall 15 of the cavity 13 at such an angle that transmission through the wall 15 would be possible in the absence of optical isolators 18.

Figure 3:
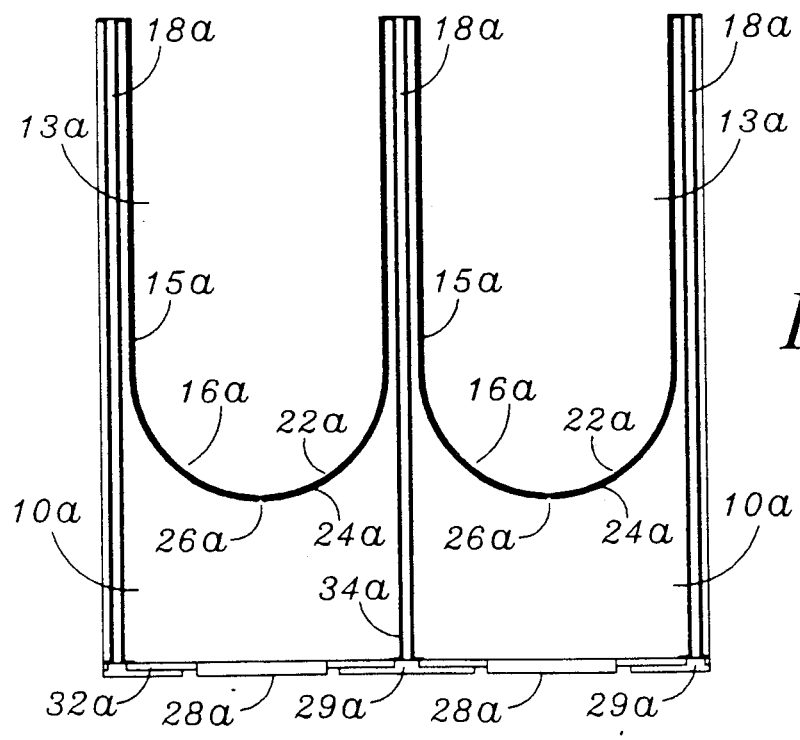
FIG. 3 is a cross-sectional side view of two cylindrical cavities of a second embodiment of a recessed element photosensitive detector array with optical isolation of the present invention having spherical floors.
Figure 4:
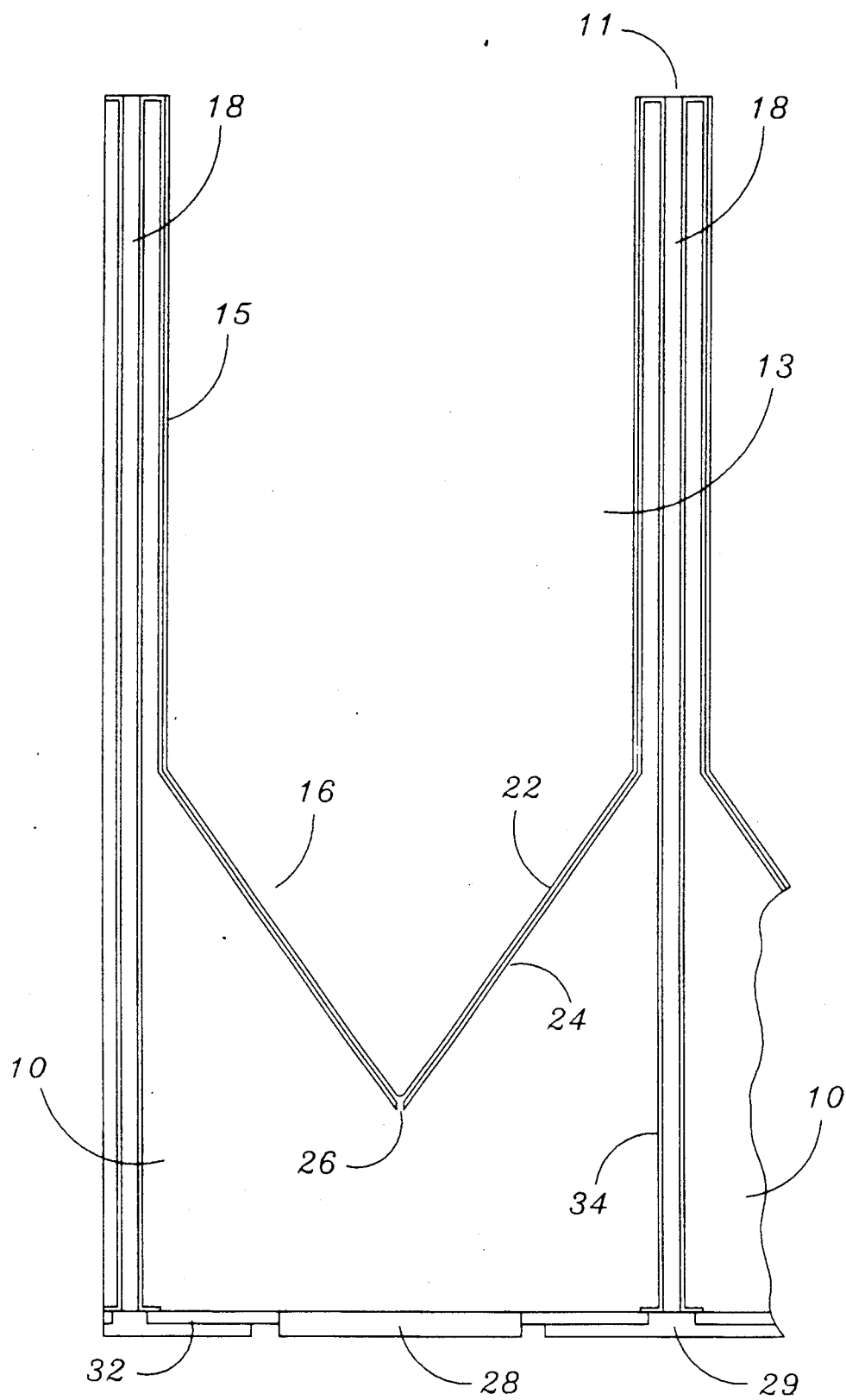
FIG. 4 is an enlarged cross-sectional side view of a single cavity of FIG. 2.
Figure 5:
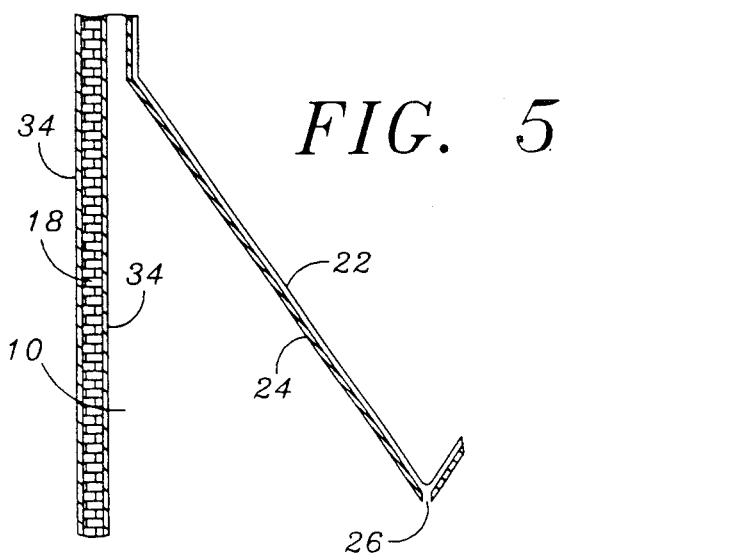
FIG. 5 is an enlarged cross-sectional side view of a portion of the pyramidal floor of the cavity of FIG. 4.
Figure 6:
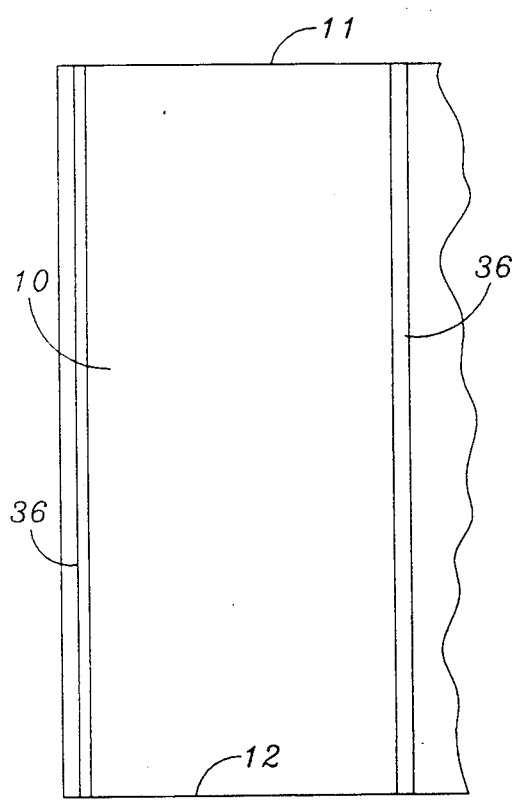
FIG. 6 is a cross-sectional side view of a substrate having moats formed therein prior to the formation of a cavity therein.

Referring now to FIG. 3, a second preferred embodiment of the recessed element photosensitive detector array with optical isolation of the present invention is depicted. The reference numbers of structures in the second embodiment have an "a" suffix added to depict structures corresponding to those of the first embodiment of FIG. 2.

The second embodiment of the present invention utilizes a spherical floor 16a as opposed to the pyramidal floor 16 of the first embodiment depicted in FIG. 2. Those skilled in the art will recognize that many different geometric shapes are suitable for the floor of the present invention. The shape of the floor should be designed to minimize reflection of photons out of the cavity 13 or 13a. Thus, a floor which tends to either reflect incident photons deeper into the cavity and onto another section of the floor or which tends to reflect incident photons onto the walls of the cavity is preferred.

As in the first embodiment of the recessed element photosensitive detector array, the second embodiment utilizes an aperture 26a formed in the semiconductor material of a second type to permit electrical contact of the semiconductor material of a first type 22a to the substrate 10a, which is the same first type as 22a.

Referring now to FIGS. 2 and 6-11, the method of forming a recessed element photosensitive detector array with optical isolation of the present invention will be described. As depicted in the cross-sectional side view of FIG. 6, rectangular moats 36 are formed in a substrate 10 by a conventional semiconductor fabrication process such as ion etching, ion milling or laser cutting. The moats 36 can be formed completely through the substrate 10, i.e. from the first surface 11 to the second surface 12, if the substrate 10 is supported such that the cut substrate sections remain in their relative positions. This may be done by temporarily attaching the substrate to a handling apparatus. The substrate may be adhesively bonded to the second substrate or handling apparatus such that the cut sections of the substrate 10 maintain their positions after the moats 36 are formed therethrough.

Alternatively, the moats 36 may be formed only partially through the substrate 10 and the subsequent diffusion and metallization processes described below then performed prior to the continued cutting of the moats 36 through the substrate 10. The moats 36 could be formed, for example, halfway down from the first surface 11 into the substrate 10. The diffusion and metallization processes could then be performed to fill the partially cut moats 36 with metal. The metal within the moat 36 would then serve to maintain the relative positions of each portion of the substrate as the cutting of the moats 36 is continued from the second surface 12 of the substrate 10. The moats 36 would then be cut from the second surface 12 until the metal deposited within the previously cut moats is reached, thereby forming moats completely from the first surface 11 to the second surface 12. The cut from the second surface 12 could then be filled with metal, thus completely filling the moats from the first surface 11 to the second surface 12 with metal.

In either method, the moats 36 of the preferred embodiments are formed through the substrate 10 and will substantially surround the cavities 13 to be formed therein. When these moats 36 are filled with an opaque layer of optical insulating material 18 such as metal, each detector element formed with a cavity 13 will be effectively optically isolated from adjacent cavities 13. The layer of optical insulating material operates to substantially prevent crosstalk among adjacent detector elements for low angle of incidence photons. Optical isolation is most crucial near the first surface 11, where low incidence photons are likely to strike the wall 15 if the cavity 13.

Figure 7:
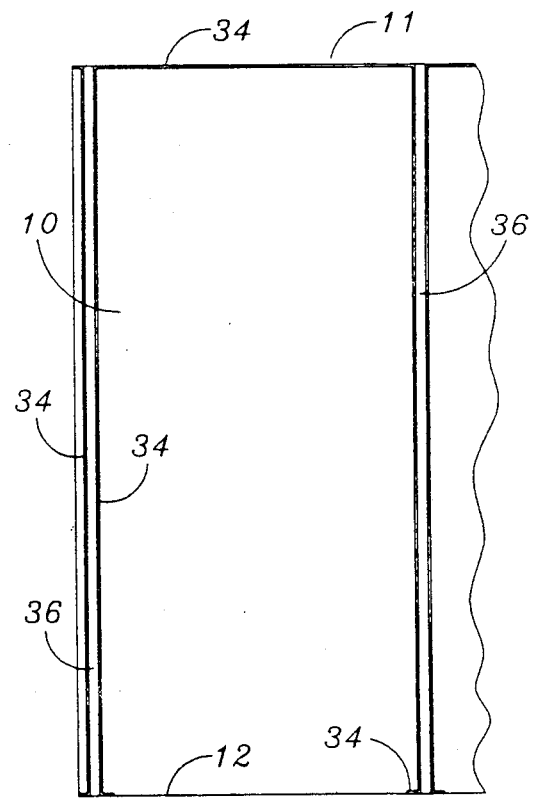
FIG. 7 is a cross-sectional side view of the substrate of FIG. 6 having an impurity dopant of the opposite type to the substrate diffused into the walls of the moat and into the substrate surfaces.

Referring now to FIG. 7, an impurity dopant of opposite type 24 to that of the substrate 22, e.g., an n-type dopant for a p-type substrate, is diffused into the walls of the moat 36 and into the first 11 and second 12 substrate surfaces as shown. The impurity dopant forms a diffusion layer 34 which serves as an electrically isolated conductor between the semiconductor material of a second type to be formed within the cavity 13 and the common contacts 29 for the array. The diffusion layer 34 does not extend entirely across the lower surface 12 of the substrate 10 so that the metal contacts 28 can be formed upon the substrate 10.

The moats 36 are filled with an opaque material such as a metal. The metal may be used as described above to maintain the positions of the substrate 10 sections as the moats 36 are formed and to support the conductivity of layers 34. A conventional chemical vapor deposition process may be used to form the metal optical isolators 18 within the moats 36. This metal forms optical isolators 18 which prevent low angle of incidence photons from passing through the wall 15 of one cavity 13 and entering an adjacent cavity 13, thus resulting in the formation of an erroneous image. As can be seen in FIG. 2, low angle of incidence photon 40 could be transmitted through the wall 15 of the cavity 13 upon which it is incident and then enter the adjacent cavity 13, if not prevented from doing so by optical isolator 18.

Figure 8:
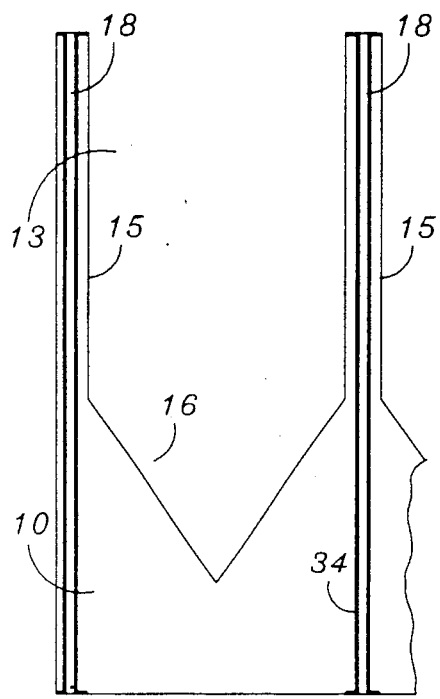
FIG. 8 is a cross-sectional side view of the substrate of FIG. 7 having a cavity with a pyramidal floor formed therein.

Referring now to FIG. 8, cavities 13 are cut into the substrate 10. The process of cutting the cavities 13 into the substrate 10 is preferably conducted in two steps. In the first step the vertical wall 15 is formed by a conventional semiconductor wafer fabrication technique such as ion etching, ion milling, laser cutting, or a combination of these techniques. In the second step the pyramidal 16 (first embodiment) or spherical 16a (second embodiment) floor is formed.

The pyramidal floor 16 can be formed in a (100) silicon substrate, for example, by anisotropic etching. Anisotropic etching is a process whereby planes at precise angles can be etched in single crystalline materials due to their crystalline structure.

A spherical floor 16a can be obtained by a number of chemical etches as those skilled in the art will recognize.

Figure 9:
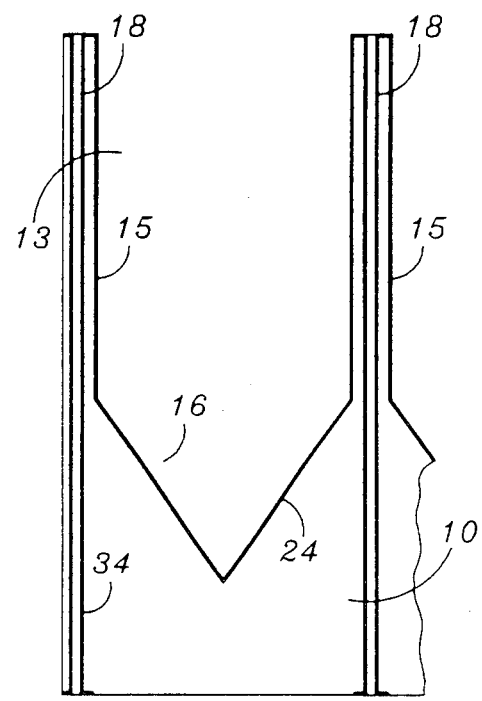
FIG. 9 is a cross-sectional side view of the substrate of FIG. 8 having a layer of material opposite in type to that of the substrate formed within the cavity.

Referring now to FIG. 9, a layer of semiconductor material of a second type 24 is formed within the cavity 13. Diffusion can be used to form the photosensitive semiconductor of a second type 24 when the layer to be formed is of the same semiconductor material as the substrate 10. Epitaxial growth is used when a different semiconductor material is desired.

Figure 10:
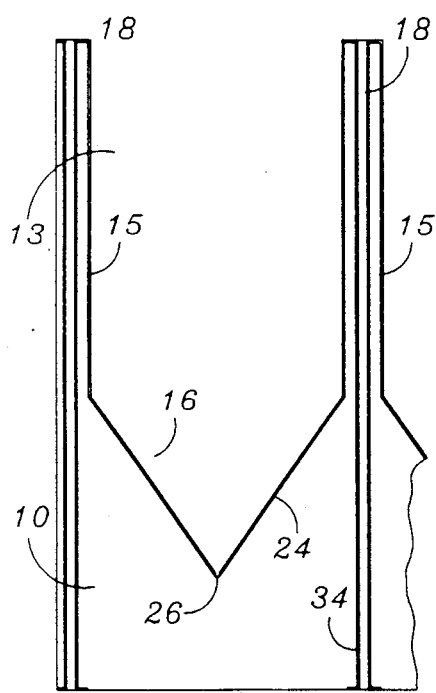
FIG. 10 is a cross-sectional side view of the substrate of FIG. 9 having a small window formed at the apex of the pyramidal floor in the layer of material opposite in type to that of the substrate.

Referring now to FIG. 10, an aperture 26 is formed at the apex of the pyramidal floor 16 or the lower most portion of the spherical floor 16a of FIG. 3. The aperture 26 will provide electrical contact from the substrate 10 to a layer of semiconductor material of a first type 22 which will be formed upon the layer of semiconductor material of a second type 24 to form the photosensitive detector element.

Figure 11:
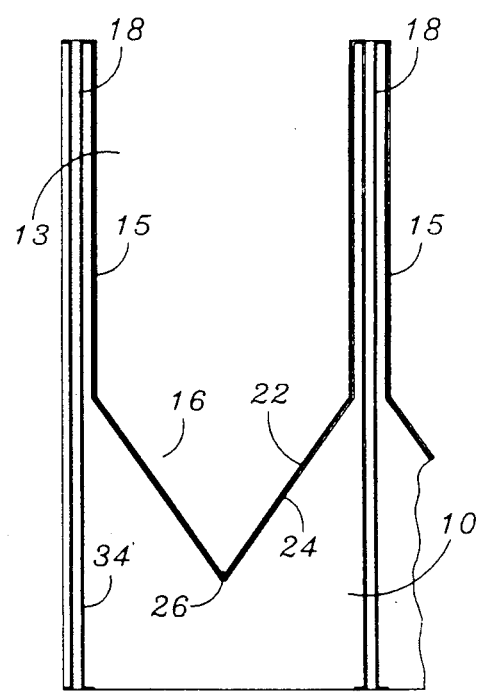
FIG. 11 is a cross-sectional side view of the substrate of FIG. 10 having an epitaxial layer of a type similar to the substrate formed within the cavity.

Referring now to FIG. 11, a layer of semiconductor material of a first type 22 is formed by either epitaxial growth or partial counter-diffusion upon the semiconductor layer of a second type 24. The p–n junction between the semiconductor layer of a first type 22 and the semiconductor layer of a second type 24 defines the photosensitive detector element which senses incident infrared radiation.

Alternatively, the cavity 13 can be filled with photosensitive material such that a plurality of layers of alternating semiconductor materials of a first and second type are provided. Thus, a photon would travel through photosensitive regions as it passes along the cavity.

Referring now to FIG. 2, insulator film 32 is deposited upon the second planar surface 12 of the substrate 10 such that a portion of the substrate 10 is exposed and a portion of the diffusion layer 34 is also exposed. The metal isolator 18 may be exposed as well. Using techniques well known in the art, windows are defined and metal is deposited to form contacts 28 and 29 upon the second planar surface 12 of the substrate 10. Metal contacts 28 and 29 provide electrical interconnection of the recessed element photosensitive detector array elements to external circuitry. The insulator film 32 insulates the metal contact 29 from the substrate 10.

Improved sensitivity is provided through the use of recessed detector elements. Elongate cavities 13 increase the probability of capturing incident photons. A first portion of the incident photons are absorbed upon initially striking the wall 15 or floor 16 of the body of detector material. A second portion of the incident photons is reflected upon striking the body of detector material. The second portion of photons tend to be reflected to another location on the wall 15 or floor 16. Thus, each reflected photon is given several opportunities to be absorbed and the requirement for an antireflective coating is thereby eliminated.

Figure 12:
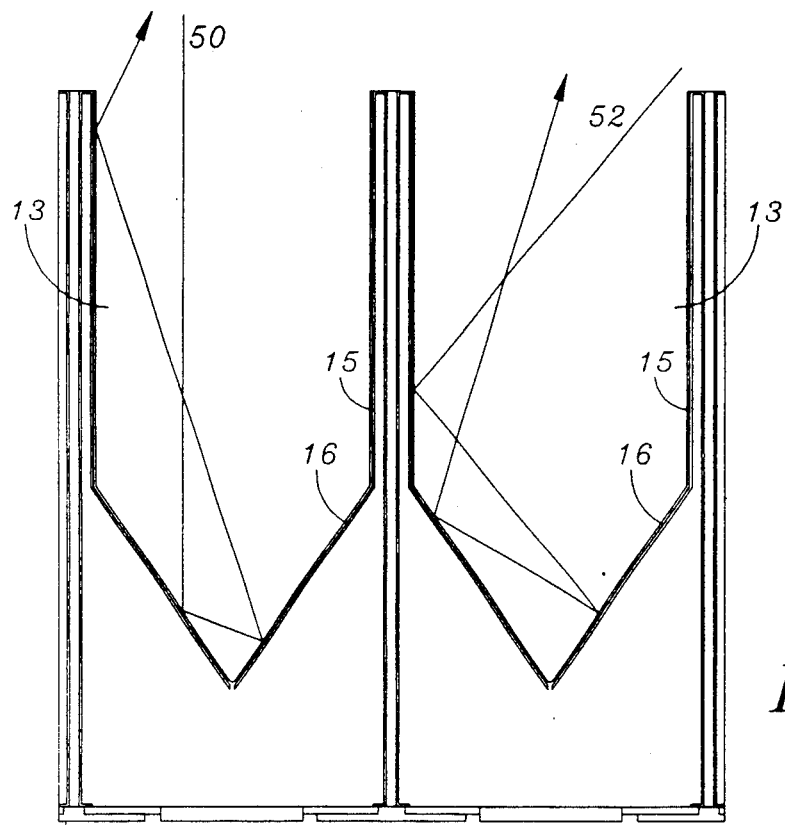
FIG. 12 is a cross-sectional side view of two of the cavities of FIG. 1 showing how an incident photon undergoes multiple reflections prior to being absorbed or escaping.

Referring now to FIG. 12, multiple reflections of incident photons 50 and 52 are illustrated. Incident photon 50 enters leftmost cavity 13 at approximately 90 degrees to the plane of the detector array. As shown, the unabsorbed portion of incident photon 50 will be reflected twice from the floor 16 and then once from the walls 15 of the cavity 13. Thus, incident photon 50 has three opportunities to be absorbed and detected.

Incident photon 52 enters rightmost cavity 13 at an angle of approximately 45 degrees to the plane of the detector array. As shown, incident photon 52 can be reflected from the wall 15 and then reflected twice from the floor 16. Thus, incident photon 52 likewise has three opportunities to be absorbed and detected.

The examples provided by incident photons 50 and 52 both illustrate three reflections, or opportunities for absorption. The exact number of reflections will depend upon the dimensions of the cavity and the angle of incidence of incident photons. Each reflection or opportunity for absorption increases the probability of detection. Therefore, the more reflections, the greater the probability of detection.

The shape and depth of the body of detector material thus functions to facilitate the absorption of the second portion of incident photons after the second portion of incident photons have been reflected from said body of detector material. The photons which are normally (in the prior art) reflected from the surfaces of said body of detector material and not absorbed are therefore reflected and then absorbed. Thus, each photon is given a plurality of opportunities to be absorbed by the body of detector material.

Figure 13:
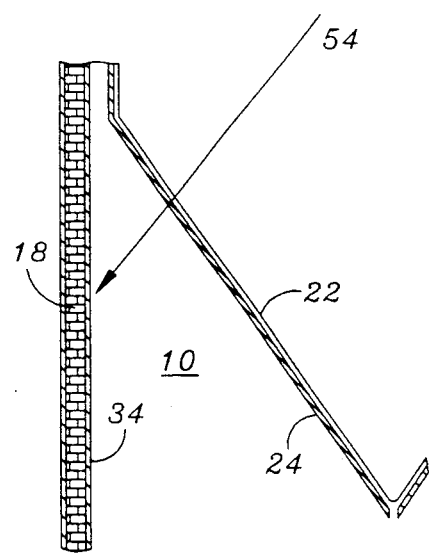
FIG. 13 is an enlarged cross-sectional side view of a portion of the pyramidal floor of the cavity of FIG. 4 showing a photon which has penetrated the semiconductor and substrate materials and which is absorbed or reflected by an optically isolating wall.

Referring now to FIG. 13, incident photon 54 has penetrated the semiconductor materials of a first 22 and second 24 type and has traveled through the substrate 10 to the optical isolator 18. The optical isolator 18 is comprised of a material, such as a metal, which is opaque to the wavelengths of incident infrared radiation. Optical isolator 18 absorbs the photon 54, thus preventing it from entering an adjacent cavity and possibly being absorbed and detected thereby.

It is understood that the recessed element photosensitive detector array with optical isolation described herein and shown in the drawings represents only presently preferred embodiments of the invention. Indeed, various modifications and additions may be made to such embodiments without departing from the spirit and scope of the invention. For example, the shape of the cavities may be varied considerably while maintaining their ability to absorb incident radiation and limit the amount of incident radiation reflected from the cavities. Also, various materials and configurations may be used to optically isolate each cavity from adjacent cavities. Thus, these and other modifications and additions may be obvious to those skilled in the art and may be implemented to adapt the present invention for use in a variety of different applications.

What is claimed is:

1. An array of recessed photosensitive detector elements formed to facilitate absorption of incident photons and reduce interelement crosstalk resulting from incident photons having a low angle of incidence, the array comprising:
    (a) a substrate;
    (b) a plurality of substantially parallel elongate cavities formed within said substrate;
    (c) a body of photosensitive material formed within each of said cavities, wherein a first portion of incident photons are absorbed by said body of photosensitive material, and a second portion of the incident photons are reflected into the cavity by a body of detector material;
    (d) wherein the shape and depth of said cavity facilitates the absorption of the second portion of incident photons after the second portion of incident photons have been reflected from said body of detector material through the cavity.

2. The array as recited in claim 1 further comprising:
    (a) a layer of optical insulating material disposed substantially intermediate each of said cavities;
    (b) wherein the layer of optical insulating material operates to substantially prevent crosstalk among adjacent detector elements for low angle of incidence photons.

3. The array as recited in claim 1 wherein the depth of said elongate cavities is greater than the width of said elongate cavities.

4. The array as recited in claim 1 wherein the second portion of incident photons are reflected a plurality of times by said body of photosensitive material prior to being absorbed by said photosensitive material.

5. The array as recited in claim 1 wherein said body of photosensitive material forms a layer within the cavity.

6. The array as recited in claim 1 wherein said body of photosensitive material fills said cavity.

7. The array as recited in claim 2 wherein said layers of optical insulating material are formed substantially surrounding each of said cavities.

8. The array as recited in claim 7 wherein said layers of optical insulating material are disposed within moats, the moats being formed substantially around said cavities.

9. The array as recited in claim 8 wherein said layers of optical insulating material are opaque to infrared radiation.

10. The array as recited in claim 9 wherein said layer of optical insulating material comprises metal.

11. The array as recited in claim 10 wherein said cavity is formed to have a floor that is pyramidal in shape.

12. The array as recited in claim 10 wherein said cavity is formed to have a floor that is spherical in shape.

13. The array as recited in claim 10 wherein said substrate comprises (100) silicon.

14. The array as recited in claim 13 wherein said body of photosensitive material further comprises:
   (a) a layer of semiconductor material of a first type formed upon said substrate within each of said cavities; and
   (b) a layer of semiconductor material of a second type formed intermediate said layer of semiconductor material of a first type and said substrate.

15. The array of claim 14 further comprising an aperture formed in the layer of semiconductor material of a second type such that direct electrical contact is provided between the layer of semiconductor material of a first type and said substrate.

16. The array as recited in claim 15 wherein a photon incident upon a first body of detector material is not incident upon a second body of detector material.

17. The array as recited in claim 16 wherein the absorption of the second portion of incident photons is responsive to the depth of said cavity.

18. The array as recited in claim 17 wherein the body of detector material formed within said cavities is formed as a lining about the surface of said cavity.

19. The array as recited in claim 18 wherein said body of detector element material is sensitive to infrared radiation.

20. The array as recited in claim 19 wherein
   (a) said substrate is comprised of CdTe; and
   (b) said body of detector material is comprised of HgCdTe.

21. A method for forming an array of recessed photosensitive detector elements formed to facilitate absorption of incident photons and reduce interelement crosstalk resulting from photons having a low angle of incidence, the method comprising the steps of:
   (a) forming a substrate;
   (b) forming a plurality of substantially parallel elongate cavities within the substrate;
   (c) forming a body of detector material within each of said cavities such that a first portion of incident photons will be absorbed upon striking a body of photosensitive material and a second portion of incident photons will be reflected upon striking a body of detector material;
   (d) wherein the step of forming a body of detector material within each of said cavities comprises forming a body of detector material within each of said cavities such that the shape and depth of said body of detector material facilitates the absorption of the second portion of incident photons after the second portion of incident photons have been reflected from said body of detector material.

22. The method as recited in claim 21 further comprising the step of forming a layer of optical insulating material substantially adjacent each of the cavities.

23. The method as recited in claim 21 wherein the step of forming a plurality of substantially parallel elongate cavities comprises forming a plurality of cavities having a depth greater than their width.

24. The method as recited in claim 21 wherein the step of forming a body of photosensitive material within each of said cavities comprises forming a layer of photosensitive material within the cavity.

25. The method as recited in claim 21 wherein the step of forming a body of photosensitive material within each of said cavities comprises filling said cavities with photosensitive material.

26. The method as recited in claim 21 wherein the step of forming a layer of optical insulating material comprises forming optical insulating material substantially surrounding each of said cavities.

27. The method as recited in claim 26 wherein the step of forming optical insulating materials substantially surrounding each of said cavities comprises:
   (a) forming moats substantially around said cavities; and
   (b) forming optical insulating material within the moats.

28. The method as recited in claim 27 wherein the step of forming optical insulating material within moats comprises forming optical insulating material opaque to infrared radiation within the moats.

29. The method as recited in claim 28 wherein the step of forming optical insulating material within moats comprises forming optical insulating material comprised of a metal within the moats.

30. The method as recited in claim 29 wherein the step of forming a plurality of substantially parallel elongate cavities within said substrate comprises forming a plurality of substantially parallel elongate cavities having a floor that is pyramidal in shape, within said substrate.

31. The method as recited in claim 29 wherein the step of forming a plurality of substantially parallel elongate cavities within said substrate comprises forming a plurality of substantially parallel elongate cavities having a floor that is spherical in shape, within said substrate.

32. The method as recited in claim 29 wherein the step of forming a substrate comprises forming a substrate of (100) silicon.

33. The method as recited in claim 32 wherein the step of forming a body of detector material within each of said cavities comprises:
   (a) forming a layer of semiconductor material of a second type upon said substrate; and
   (b) forming a layer of semiconductor material of a first type upon said semiconductor material of a second type.

34. The method as recited in claim 33 further comprising the step of forming an aperture in the layer of semiconductor material of a second type such that direct electrical contact is provided between the layer of semiconductor material of a first type and said substrate.

* * * * *